(12) United States Patent
El Waffaoui

(10) Patent No.: US 7,348,850 B2
(45) Date of Patent: Mar. 25, 2008

(54) ELECTRONIC CIRCUIT FOR AMPLIFICATION OF A BIPOLAR SIGNAL

(75) Inventor: Rachid El Waffaoui, Eindhoven (NL)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 10/575,772

(22) PCT Filed: Oct. 6, 2004

(86) PCT No.: PCT/IB2004/051986

§ 371 (c)(1),
(2), (4) Date: Apr. 12, 2006

(87) PCT Pub. No.: WO2005/039044

PCT Pub. Date: Apr. 28, 2005

(65) Prior Publication Data

US 2007/0085607 A1    Apr. 19, 2007

(30) Foreign Application Priority Data

Oct. 15, 2003    (EP) .................................. 03103807

(51) Int. Cl.
*H03F 3/04* (2006.01)

(52) U.S. Cl. ...................... 330/288; 330/265; 330/263

(58) Field of Classification Search ................ 330/265, 330/263, 288
See application file for complete search history.

(56) References Cited

U.S. PATENT DOCUMENTS

| | | | | |
|---|---|---|---|---|
| 4,045,747 A | * | 8/1977 | Hsu | ............................ 330/277 |
| 4,728,815 A | | 3/1988 | Main | |
| 5,399,991 A | * | 3/1995 | Moraveji | ..................... 330/255 |
| 5,455,533 A | * | 10/1995 | Kollner | ...................... 327/484 |
| 5,614,866 A | * | 3/1997 | Dow | ........................... 330/267 |
| 5,654,629 A | * | 8/1997 | Theus | ........................ 323/316 |

FOREIGN PATENT DOCUMENTS

| | | |
|---|---|---|
| EP | 0 387 951 | 9/1990 |
| WO | WO 00/31604 | 6/2000 |
| WO | WO 02/19050 | 3/2002 |

* cited by examiner

*Primary Examiner*—Patricia Nguyen
(74) *Attorney, Agent, or Firm*—Peter Zawilski

(57) ABSTRACT

Consistent with an example embodiment, there is an electronic circuit for amplification of bipolar symmetric current signals. The electronic circuit has a pair of complimentary current mirrors. Depending on the polarity of the bipolar current signal one or the current mirrors is active while the other current mirror is in an off state. This way adding a biasing current to the input signal is avoided which substantially reduces noise.

16 Claims, 6 Drawing Sheets

ELECTRONIC CIRCUIT FOR AMPLIFICATION OF A BIPOLAR SIGNAL

The present invention relates to the field of low noise signal amplification, and more particularly without limitation to amplification of bipolar current signals, especially symmetrical signals.

The usage of current mirror circuits for the purposes of signal amplification is as such known from the prior art. WO00/31604 shows a current mirror circuit where the transconductance stage generates a current which is divided over first and second semiconductor elements, so that the input voltage is maintained close to a reference voltage. This way the input impedance significantly decreases in order to obtain a large bandwidth. However, the input impedance depends on the current amplification factor of the semiconductor elements which in turn is dependent on the input current.

Figure 1:
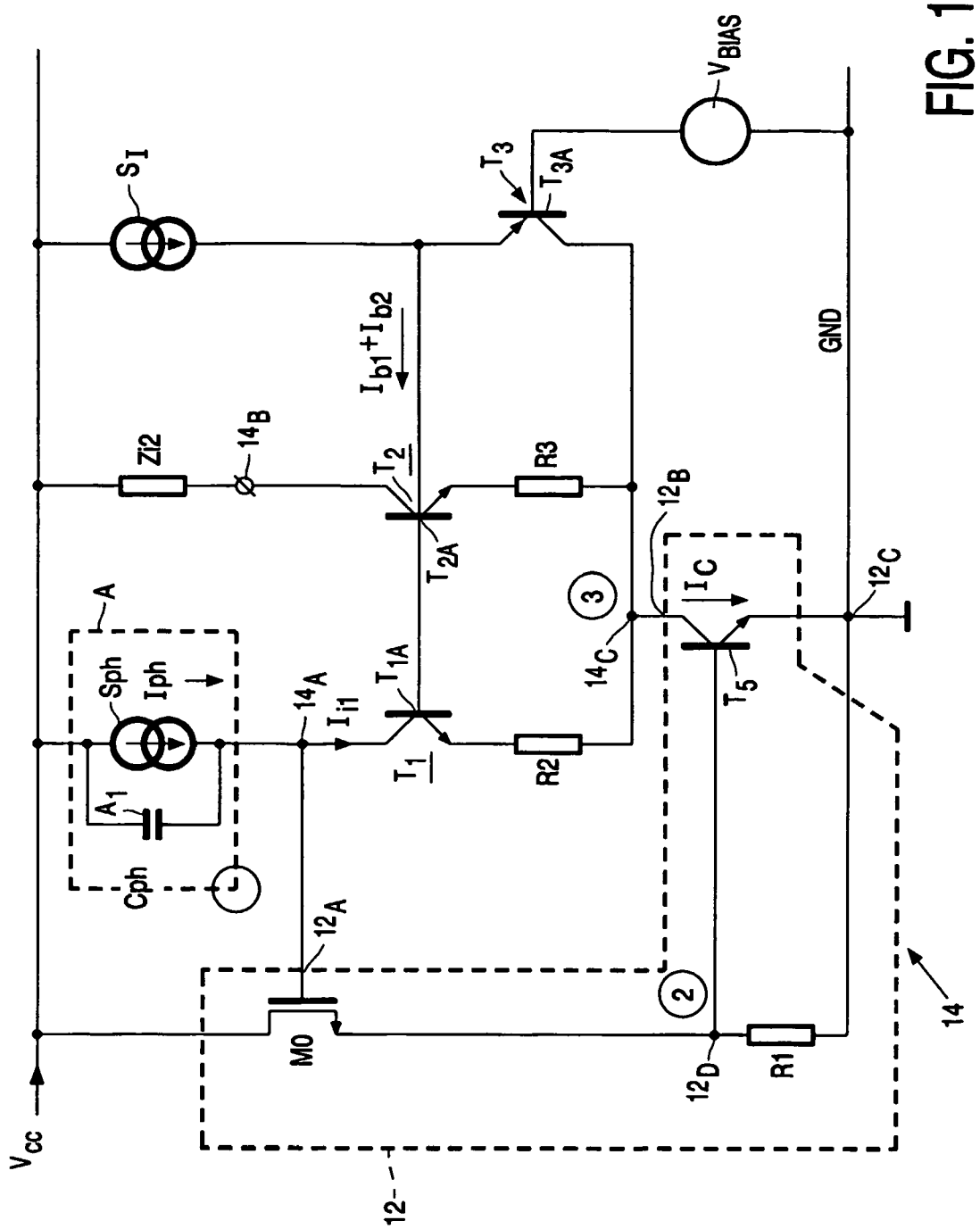

WO02/19050 shows a current mirror circuit in which the dependence of the bandwidth on the input current is reduced. Such a current mirror circuit is shown in FIG. 1:

FIG. 1 shows an embodiment of current mirror stage 14. The current mirror circuit includes a current input terminal 14A, a current output terminal 14B and a common terminal 14C. The input terminal 14A is connected to a photodiode A, which is represented here in the form of a signal current source Sph and a parasitic capacitance Cph. The output terminal 14B is connected to a load Zi2.

A first controllable semiconductor element T1 is arranged between the current input terminal 14A and the common terminal 14C. A second controllable semiconductor element T2 is arranged between the current output terminal 14B and the common terminal 14C. In case the semiconductor elements T1, T2 are connected to the common terminal via degeneration resistors R2, R3. The controllable semiconductor elements T1, T2 have interconnected control electrodes T1A, T2A, which are also coupled to a bias voltage source $V_{BIAS}$, for biasing said control electrodes at a reference voltage.

The circuit further includes a transconductance stage 12 having an input 12A coupled to the current input terminal 14A and an output 12B coupled to the common terminal 14C.

The circuit is characterized in that the interconnected control electrodes T1A, T2A are coupled to the common terminal via a third controllable semiconductor element T3, and in that the bias voltage source $V_{BIAS}$ is coupled to these control electrodes T1A, T2A via a control electrode T3A of the third controllable semiconductor element T3. The interconnected control electrodes T1A, T2A are further connected to a current source S1.

In the embodiment shown the transconductance stage 12 comprises a fifth controllable semiconductor element T5 which is arranged between its output 12B and ground GND. The fifth controllable semiconductor element T5 has a control electrode which is coupled to a common node 12D of a series arrangement of a further controllable semiconductor element M0 and a resistive impedance R1. The current source S1 both biases the third and fifth controllable semiconductor elements T3 and T5.

The circuit shown in FIG. 1 operates as follows. If the photodiode provides a current Iph to the input terminal 14A of the current mirror, the transconductance stage 12 will withdraw a current Ic from the common terminal 14C of the current mirror such that the current Li1 via the input terminal 14A equals the current Iph provided by the photodiode A.

The operation of the current mirror formed by T1 and T2 has the effect that a current L01 is delivered by the second controllable semiconductor element T2. The currents have a ratio I01:Ii1=P, P being the area ratio of the controllable semiconductor elements T1, T2. At the same time the control electrodes T1A, T2A of the controllable semiconductor elements T1, T2 respectively conduct a current Ib1, Ib2 such that Ii1−αIb1 and I01=αIb2.

As the third controllable semiconductor element T3 is biased by a current source, the signal currents Ib1+Ib2 will be conducted substantially from the common terminal 12B via the main current path of that semiconductor element T3. Hence these signal currents Ib1, Ib2 substantially do not contribute to the current Ic withdrawn by the transconductance stage 12. The current Ic therefore is Ii1(1+P). If the transconductance stage has an amplification gm, then the input resistance amounts to (1+P)/gm which is independent of the current amplification of the controllable semiconductor elements T1, T2, where 1:P is the area ratio of the semiconductor elements and/or of the capacitive impedences.

A disadvantage of the prior art current mirror circuit of FIG. 1 is that it requires bias current Iph in the signal path if the input signal is bipolar or if the circuit is accoupled to the source. This way a substantial amount of noise is added to the input signal which degrades performance of the current mirror circuit.

The present invention provides for an electronic circuit for amplification of a bipolar current signal. The electronic circuit has a pair of complimentary current mirrors. The current mirrors are interconnected at an input terminal and at an output terminal of the electronic circuit. When the bipolar current signal is applied to the input terminal one of the current mirrors of the complimentary pair is active while the other one is in an off state. For example, during a positive signal swing of the bipolar current signal a first one of the current mirrors of the complimentary pair is active while the other one is off; likewise, when a negative signal swing of the bipolar current signal occurs the active current mirror transitions into an off state while the other one becomes active.

It is a particular advantage of the present invention that the electronic circuit is usable for bipolar, symmetrical current signals without a requirement for adding any DC biasing current at the input terminal. Thus the electronic circuit of the invention has a low noise performance which makes it particularly suitable for applications in the field of medical instrumentation, mobile phones, as well as digital broadcasting system, such as digital audio broadcasting (DAB) and digital video broadcasting (DVB).

In accordance with a preferred embodiment of the invention bypass capacitors are coupled to the current mirrors. By means of the bypass capacitors signal distortion is avoided when the polarity of the bipolar current signal applied at the input terminal changes. Further the bypass capacitors are beneficial as the stability of the feedback loop of the circuit is improved. Another advantage is that by means of the bypass capacitors the bandwidth of the electronic circuit becomes independent from the bipolar current signal applied at the input terminal. Preferably the bypass capacitors have small values in the order of a few pF.

In accordance with a further preferred embodiment of the invention a pair of degeneration resistors is coupled to each one of the complimentary current mirrors. By means of the degeneration resistors the matching at high currents is improved while the shot noise at high current is reduced. Further the stability of the feedback loop is improved, especially if the degeneration resistors are connected in series with the base-emitter capacitance of the respective current mirror.

In accordance with a further preferred embodiment of the invention the input terminal of the electronic circuit is coupled to a control terminal of a feedback transistor which provides the feedback loop. Preferably an NMOS-type transistor is used for the feedback transistor; alternatively a NPN-type feedback transistor can be used.

In accordance with a further preferred embodiment of the invention a bipolar current signal is applied to the electronic circuit by means of a resistor being connected to the input terminal. As the input terminal is connected to virtual ground the resistor coupled to the input terminal transforms the bipolar current signal to a bipolar current signal at the input terminal of the electronic circuit.

It is a particular advantage of the present invention that an electronic circuit can be realized where the noise at low frequencies is substantially zero if no input signal is applied to the input terminal. This enables applications of the electronic circuit for zero-intermittent frequency (IF) or low-IF receivers, such as for mobile telephone, DAB, DVB, and medical systems. Further the electronic circuit can be used to amplify the current delivered by a passive MOS mixer.

Figure 2:
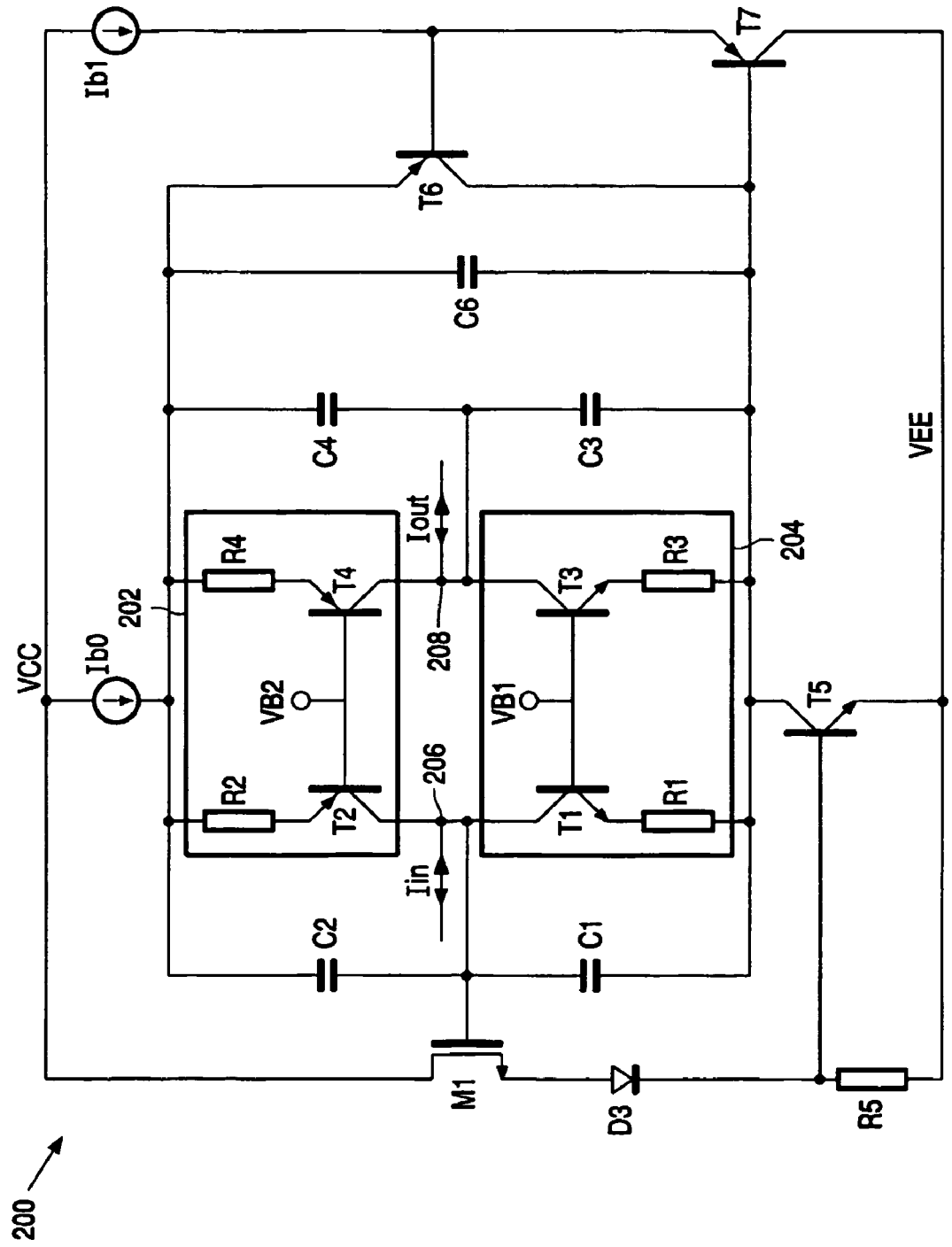
Figure 3:
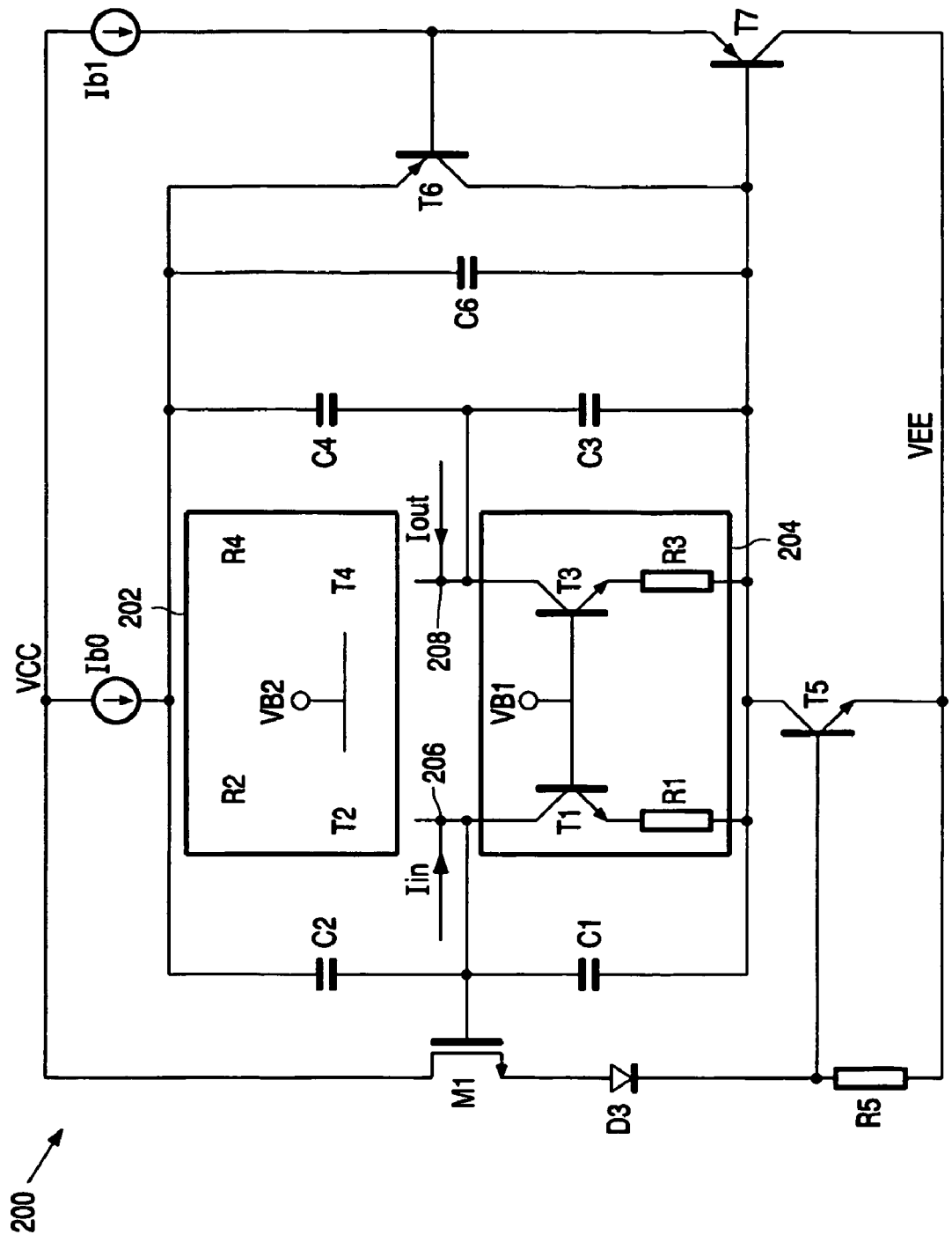
Figure 4:
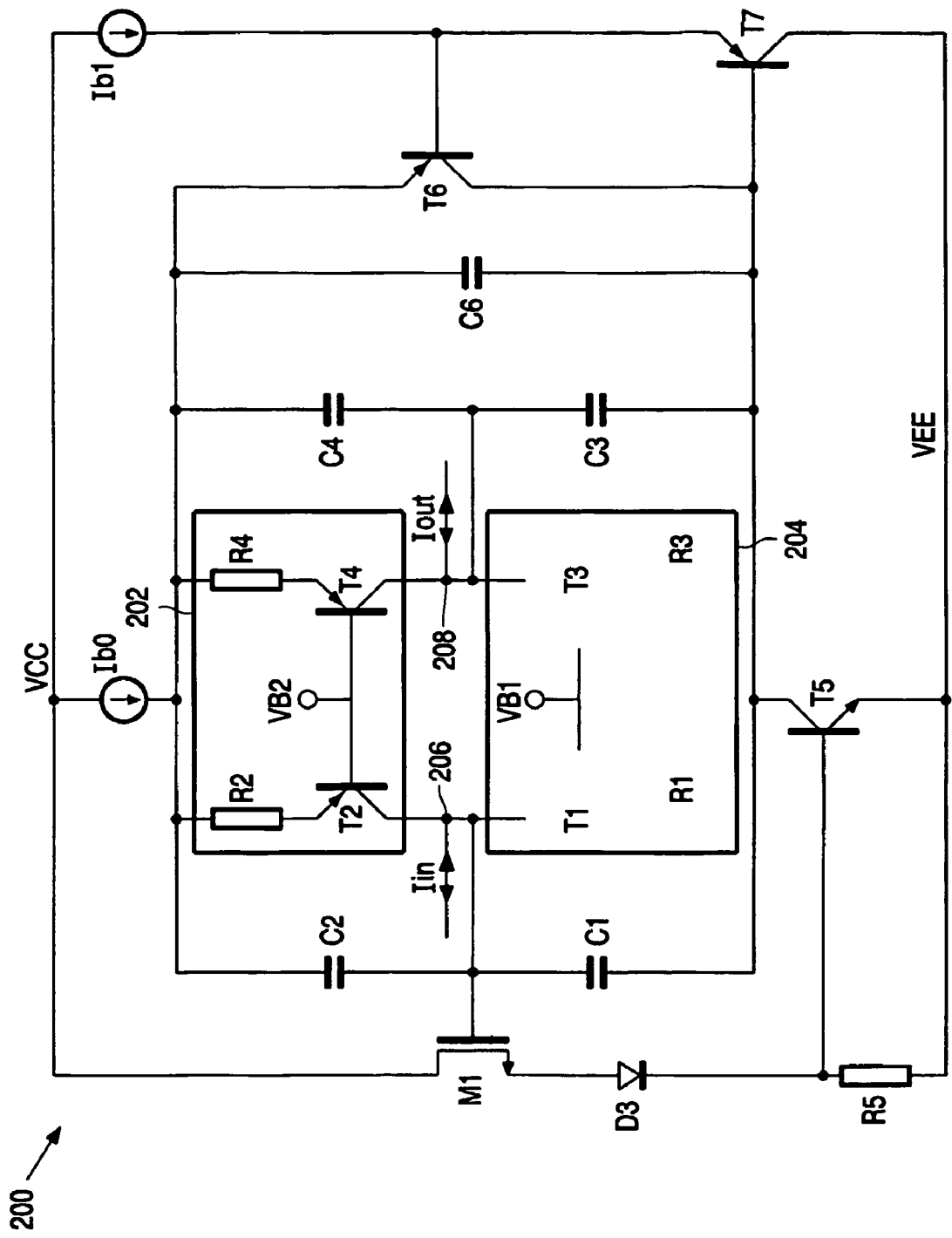
Figure 5:
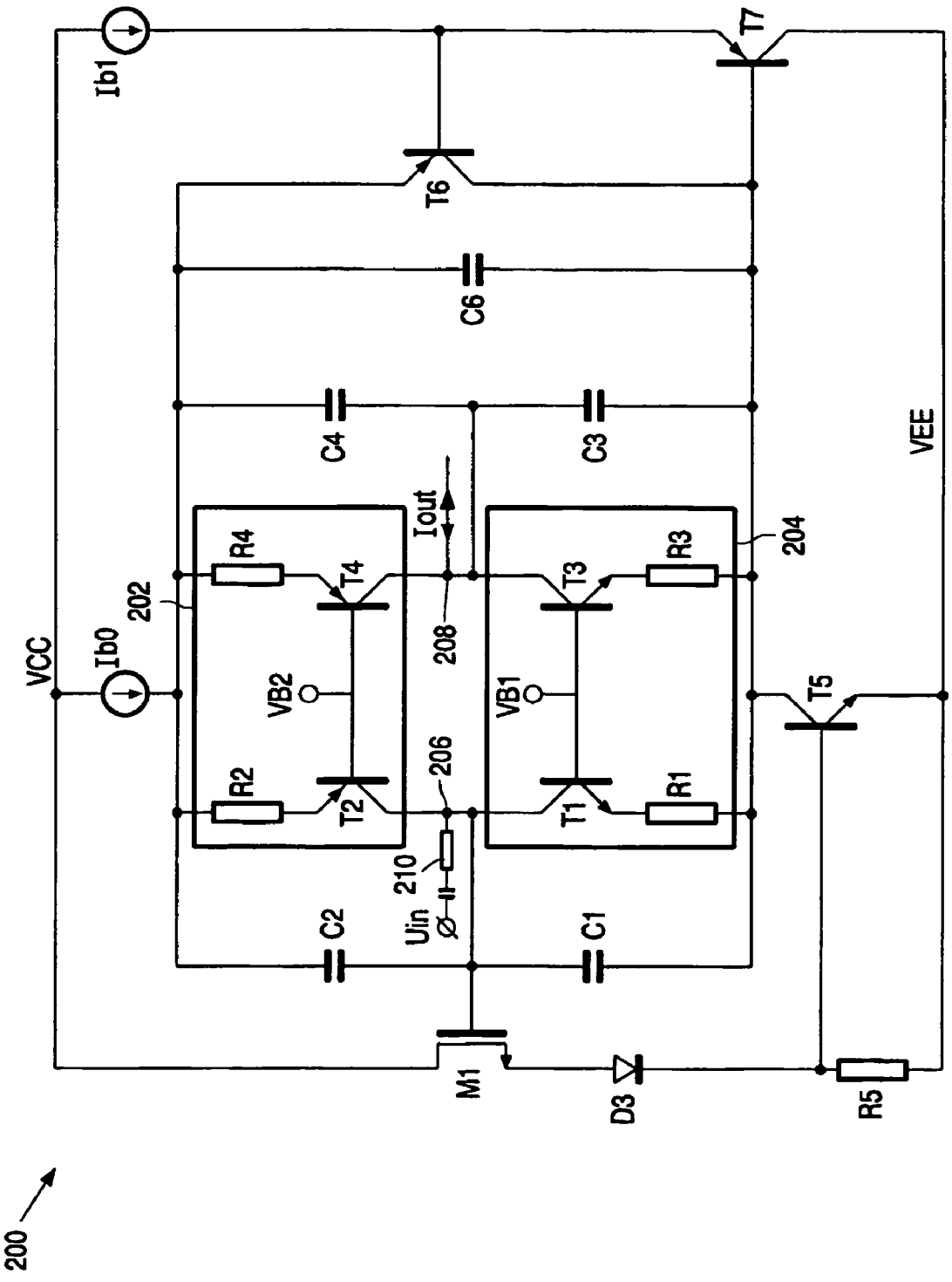
Figure 6:
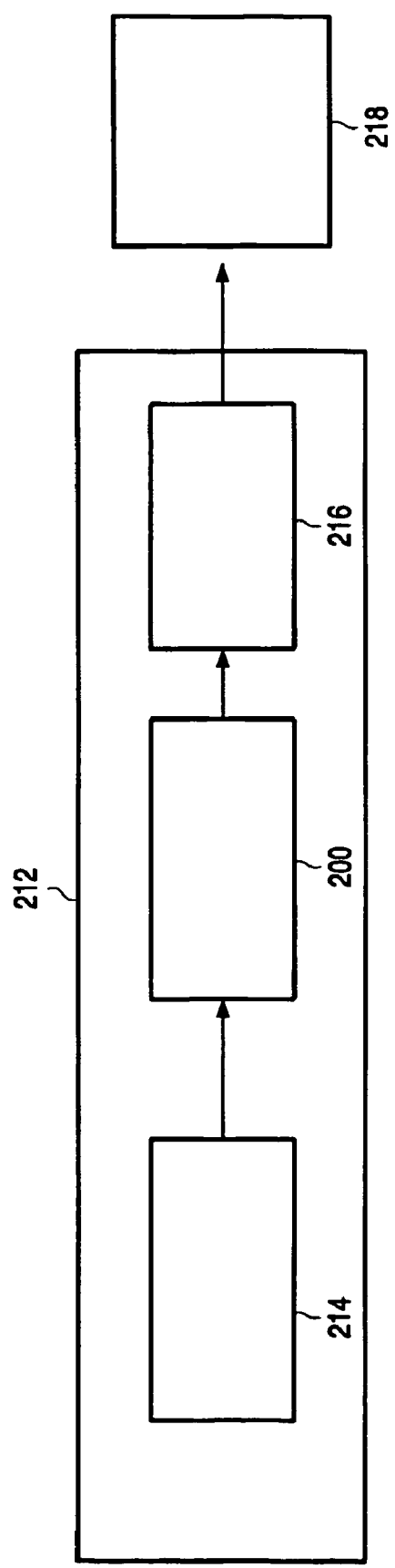

In the following the invention will be described in greater detail by making reference to the drawings in which:

FIG. 1 is a circuit diagram of a prior art current mirror circuit,

FIG. 2 is a circuit diagram of a preferred embodiment of an electronic circuit of the invention, FIG. 3 illustrates operation of the electronic circuit of FIG. 2 during a positive signal swing, FIG. 4 illustrates operation of the electronic circuit of FIG. 2 during a negative signal swing, FIG. 5 shows a preferred embodiment of the electronic circuit for amplification of a bipolar voltage signal, FIG. 6 is a block diagram for an ultrasound application of the electronic circuit.

FIG. 2 shows electronic circuit 200 which has PNP current mirror 202 and complimentary NPN current mirror 204.

PNP current mirror 202 has PNP transistors T2 and T4 and degeneration resistors R2 and R4. Likewise NPN current mirror 204 has NPN transistors T1 and T3 and degeneration resistors R1 and R3.

The emitters of transistors T1 and T2 are connected at input terminal 206 and the collectors of transistors T3 and T4 are connected at output terminal 208.

Further bypass capacitors C1, C2, C3 and C4 are coupled to PNP current mirror 202 and NPN current mirror 204. A feedback loop is formed by feedback transistor M1, transistor T5, transistor T6, transistor T7 and capacitor C6. Further electronic circuit 200 has biasing current sources Ib0 and Ib1. It is to be noted that none of the current sources is located in the signal path which avoids that noise of one of the biasing current sources is added to the input signal applied at input terminal 206.

The bypass capacitors C1, C2, C3 and C4 are beneficial as signal distortion is avoided when the polarity of the input signal Iin at the input terminal 206 changes. Further the stability of the feedback loop is improved by the bypass capacitors and the bandwidth of electronic circuit 200 is made independent of the input signal Iin.

Degeneration resistors R1, R2, R3, and R4 do further improve the stability of the feedback loop as each degeneration resistor is connected in series with the base-emitter capacitance of the respective current mirror. Further the degeneration resistors improve matching at high currents and reduce shot noise at high currents. A further beneficial effect is that the DC output impedance of electronic circuit 200 is increased.

The DC gain of electronic circuit 200 is given by:
  the ratio of T1 (T2) area to T3 (T4) area if the input current Iin applied at input terminal 206 is low,
  the ratio of R1 (R2) area to R3 (R4) area if the input current Iin is high.

The high frequency gain of the electronic circuit 200 is given by:
  the ratio of C1 (C2) area to C3 (C4) area if the input current Iin is low,
  the ratio of R1 (R2) area to R3 (R4) area if the input current Iin is high.

FIG. 3 is illustrative of the operation of electronic circuit 200 when input current Iin applied at input terminal 206 has a positive signal swing. In this instance the emitter voltage of T2 (T4) is set to a voltage equal to VB2 via VB1, T1, R1, T7, T6, R2, and R4. The transistors T2 and T4 are off. Hence PNP current mirror 202 is in an off state while NPN current mirror 204 is active.

FIG. 4 illustrates operation of electronic circuit 200 when input current Iin applied at input terminal 206 has a negative signal swing. In this instance the emitter voltage of T1 (T3) is set to a voltage equal to VB1 via VB2, T2, R2, T6, T7, R1, and R3. The transistors T1 and T3 are off. Hence NPN current mirror 202 is in an off state while PNP current mirror 202 is active.

Electronic circuit 200 as show in FIGS. 2, 3 and 4 is suitable for amplification of bipolar current signals, especially for amplification of symmetrical current signals. Amplification of a bipolar voltage signal Uin can be accomplished by voltage-current conversion of the bipolar voltage signal Uin.

As shown in FIG. 5 voltage-current conversion is accomplished by coupling of resistor 210 to input terminal 206. As input terminal 206 is connected to virtual ground a voltage-current conversion is achieved thereby. Otherwise operation of electronic circuit 200 remains unchanged.

While feedback transistor M1 shown in FIG. 5 is an NMOS-type transistor it is also possible to use a NPN-type transistor as a feedback transistor. This way the bandwidth of electronic circuit 200 can be further increased and thermal noise at high frequencies can be reduced.

The input noise at low frequency is dominated by the shot noise of the current mirrors and the thermal noise of the degeneration resistors.

The noise at high frequencies is dominated by the thermal noise, which is converted to a current noise via the input capacitance:

$$i_{HF}^2(f) = 4kTR_{eq}(C_{inT}\omega)^2 A^2/Hz$$

$R_{eq}$ is the equivalent noise resistance. $C_{inT}$ is the equivalent input capacitance.

FIG. 6 is illustrative of an application of electronic circuit for medical ultrasound apparatus 212. Ultrasound apparatus 212 has ultrasound sensor 214 for receiving an ultrasound signal. Ultrasound sensor 214 outputs a bipolar current signal which is representative of the received ultrasound signal. The bipolar current signal is amplified by electronic circuit 200 which is coupled to the output of ultrasound sensor 214.

The amplified signal is provided from electronic circuit 200 to image processing module 216 which generates image data on the basis of the amplified signal delivered by electronic circuit 200. Image processing module 216 is coupled to display 218 in order to generate an image output for a user.

| LIST OF REFERENCE NUMERALS: | |
|---|---|
| 200 | Electronic circuit |
| 202 | PNP current mirror |
| 204 | NPN current mirror |
| 206 | Input terminal |
| 208 | Output terminal |
| 210 | Resistor |
| 212 | Ultrasound apparatus |
| 214 | Ultrasound sensor |
| 216 | Image processing module |
| 218 | display |

The invention claimed is:

1. An electronic circuit for amplification of a bipolar current signal, the electronic circuit comprising a pair of complementary current mirrors, the current mirrors being interconnected at an input terminal and at an output terminal, wherein a first complementary current mirror of the pair of complementary current mirrors is active and a second complementary current mirror of the pair of complementary current mirrors is off when a positive current signal is applied at the input terminal and wherein the second complementary current mirror is active and the first complementary current mirror is off when a negative current signal is applied at the input terminal.

2. The electronic circuit of claim 1, wherein the first current mirror is a NPN current mirror and the second current mirror is a PNP current mirror.

3. The electronic circuit of claim 1, further comprising bypass capacitors being coupled to the first and second current mirrors.

4. The electronic circuit of claim 1, further comprising a pair of degeneration resistors for each one of the first and second current mirrors.

5. The electronic circuit of claim 1, further comprising a feedback transistor, a control terminal of the feedback transistor being coupled to the input terminal.

6. The electronic circuit of claim 5, the feedback transistor being an NMOS-type transistor.

7. The electronic circuit of claim 5, the feedback transistor being an NPN-type transistor.

8. The electronic circuit of claim 1, further comprising a resistor being coupled to the input terminal for providing a bipolar voltage signal input terminal.

9. An ultrasound apparatus comprising:
an ultrasound receiver for providing an ultrasound bipolar current signal,
a pair of complementary current mirrors, the current mirrors being interconnected at a first terminal and at a second terminal, the first terminal being coupled to the ultrasound receiver for receiving the ultrasound bipolar current signal,
wherein a first current mirror of the pair of complementary current mirrors is active during a positive swing of the ultrasound bipolar current signal while a second current mirror of the pair of complementary current mirrors is off, and wherein the second current mirror is active during a negative signal swing of the ultrasound bipolar current signal while the first current mirror is off.

10. An electronic circuit for amplification of a bipolar current signal, the electronic circuit comprising:
a pair of complementary current mirrors, the current mirrors being interconnected at an input terminal and at an output terminal; and
bypass capacitors being coupled to the first and second current mirrors,
wherein a first complementary current mirror of the pair of complementary current mirrors is active when a positive current signal is applied at the input terminal and wherein the second complementary current mirror of the pair of complementary current mirrors is active when a negative current signal is applied at the input terminal.

11. The electronic circuit of claim 10, wherein the first current mirror is a NPN current mirror and the second current mirror is a PNP current mirror.

12. The electronic circuit of claim 10, further comprising a pair of degeneration resistors for each one of the first and second current mirrors.

13. The electronic circuit of claim 10, further comprising a feedback transistor, a control terminal of the feedback transistor being coupled to the input terminal.

14. The electronic circuit of claim 13, the feedback transistor being an NMOS-type transistor.

15. The electronic circuit of claim 13, the feedback transistor being an NPN-type transistor.

16. The electronic circuit of claim 10, further comprising a resistor being coupled to the input terminal for providing a bipolar voltage signal input terminal.

\* \* \* \* \*